(12) United States Patent
Tometsuka

(10) Patent No.: US 6,712,909 B2
(45) Date of Patent: Mar. 30, 2004

(54) SUBSTRATE PROCESSING APPARATUS AND METHOD FOR MANUFACTURING SEMICONDUCTOR DEVICE

(75) Inventor: Kouji Tometsuka, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 12 days.

(21) Appl. No.: 10/196,204

(22) Filed: Jul. 17, 2002

(65) Prior Publication Data
US 2003/0015138 A1 Jan. 23, 2003

(30) Foreign Application Priority Data
Jul. 19, 2001 (JP) .......................... 2001-220166

(51) Int. Cl.[7] .............................. C23C 16/00
(52) U.S. Cl. .................. 118/725; 118/728; 118/733
(58) Field of Search ................. 438/715, 725, 438/728, 733

(56) References Cited

U.S. PATENT DOCUMENTS

| 5,016,567 | A | | 5/1991 | Iwabuchi et al. | |
|---|---|---|---|---|---|
| 5,484,484 | A | * | 1/1996 | Yamaga et al. | 118/719 |
| 5,750,436 | A | * | 5/1998 | Yamaga et al. | 438/558 |
| 6,030,457 | A | * | 2/2000 | Shimazu et al. | 118/715 |
| 6,235,121 | B1 | * | 5/2001 | Honma et al. | 118/730 |
| 6,403,926 | B2 | * | 6/2002 | Li | 219/390 |
| 6,448,536 | B2 | * | 9/2002 | Li et al. | 219/390 |
| 6,527,865 | B1 | * | 3/2003 | Sajoto et al. | 118/715 |

FOREIGN PATENT DOCUMENTS

| JP | A 6-302533 | 10/1994 |
|---|---|---|
| JP | B2 2691159 | 9/1997 |
| JP | A 2000-286204 | 10/2000 |

* cited by examiner

Primary Examiner—Alexander Ghyka
(74) Attorney, Agent, or Firm—Oliff & Berridge, PLC

(57) ABSTRACT

A substrate processing apparatus and a method for manufacturing a semiconductor device can resolve the problems that semiconductor film by-products are incorporated into a boat rotation mechanism so as to allow the mechanism portion to be locked, whereby a high quality semiconductor film can be generated with stability for a long period of time.

4 Claims, 4 Drawing Sheets

SUBSTRATE PROCESSING APPARATUS AND METHOD FOR MANUFACTURING SEMICONDUCTOR DEVICE

BACKGROUND OF INVENTION

1. Field of the Invention

This invention relates to a substrate processing apparatus and a method for manufacturing a semiconductor device.

2. Description of the Related Art

Conventionally, in a semiconductor manufacturing process, a CVD apparatus, an oxide film forming apparatus, a diffusion apparatus or the like is used to perform film formation of an oxide film or a thin film of $Si_3N_4$ film and the like on a surface of a semiconductor substrate, which is a body to be processed, for example, a semiconductor wafer, or to perform diffusion of impurities. Recently, a substrate processing apparatus using a vertical type thermal treatment furnace is utilized in order to perform processing with high accuracy.

In a vertical type reaction furnace which is such a substrate processing apparatus, generally as shown in FIG. 3, a tube-shaped furnace having a heater 1 for heating is vertically disposed, and within this tube-shaped furnace, an inner reaction tube 3 and an outer reaction tube 2 made of quartz are provided. A furnace opening flange 4 which is an inlet adapter is provided at a lower end of the outer reaction tube 2 via an O-ring, and a lower end of the inner reaction tube 3 is secured to an inner circumferential surface of the furnace opening flange 4. Moreover, a process gas introduction tube (a process gas introduction nozzle) 18 which is a process gas supply line is allowed to be in communication with a furnace opening 27 configured as an inside space of the furnace opening flange 4.

On the other hand, many semiconductor wafers 16 which are substrates to be processed are accommodated and loaded in a boat 15 in a vertical direction with the respective wafers being in a horizontal state. The boat 15 is then placed on a boat support base 13, and loaded into the above-said inner reaction tube 3 by allowing the boat 15 to move up by an appropriate hoisting and lowering apparatus. A furnace opening 27 is then airtightly covered with a furnace opening seal which comprises a disk-shaped cover body 7 at a lower part of the boat support base 13 via an O-ring 5 so that one closed substrate processing space (a reaction chamber) 26 is formed. Moreover, the boat support base 13 is supported by a rotation shaft 11 so that it is constructed to be rotatable by a boat rotation mechanism 10.

An appropriate reaction gas (process gas) is introduced into the inner reaction tube 3 which constructs such a reaction chamber, from the process gas introduction tube (process gas introduction nozzle) 18 which is a process gas supply line. The reaction furnace is constructed to perform prescribed processing, for example, of performing film formation of a thin film of $SiN_4$ film on silicon wafers, and the like, in the furnace using the reaction gas. In addition, 25 represents a gas exhaust tube.

In such wafer processing, the boat 15 and the boat support base 13 are allowed to rotate by the boat rotation mechanism 10 in order to improve uniformity of a CVD film generated on the wafers.

As mentioned above, the wafers 16 are loaded onto the boat 15 and heated by a heater 1, at the same time, the process gas is introduced from the process gas introduction tube (the process gas in) 18, and the gas passes through the wafer region to allow a gas phase chemical reaction to be performed, and an exhaust gas is exhausted from a gas exhaust tube (a process gas out) 12 whereby the wafer processing is performed.

Here, in the wafer processing wherein the boat 15 and the boat support base 13 are rotated by the boat rotation mechanism 10 in order to improve uniformity of a CVD film formed on the wafers, a conventional problem is that, when the boat rotation mechanism 10 is installed to be exposed to an inside of the reaction chamber, by-products in the wafer processing adhere to its rotation mechanism portion so that the rotation mechanism 10 is allowed to seize.

As a solution to such a disadvantage, an application of known techniques such as the following (a), (b) and (c) which prevent the process gas from entering a circumference of a rotation shaft of the rotation mechanism, is considered to be effective.

For example, (a) Japanese Patent Application Laid-Open No 2000-286204 and (b) Japanese Patent Application Laid-Open No. 6-302533 disclose a technique wherein, in order to prevent corrosion by the reaction gas of metal parts such as a boat rotation shaft and the like, a portion with concavities and convexities which interpose one another is formed at a lower surface of a boat cap made of quartz (a boat support base) and at an upper surface of a base made of quartz (a cover body), and N2 gas is injected into a gas flow passage formed by a clearance between the concavities and convexities from a side of the rotation shaft.

Moreover, (c) Japanese Patent No. 2,691,159 discloses a technique wherein, in a construction which covers a furnace opening with a cover body 59 made of metal (stainless), as shown in FIG. 4, a barrier 63 made of quartz is provided around a circumference of a magnetic fluid seal unit 62 of a rotation shaft 61, and a purge gas is introduced into a purge gas supply space 73 formed by the barrier 63 made of quartz and a lower surface of a turntable 64 so as to allow a pressure of the space to be at a positive pressure compared to a pressure in a reaction vessel thereby preventing intrusion of a reaction gas into the magnetic fluid seal unit 62.

However, the conventional techniques (a) and (b) use the cover body made of quartz and the boat cap made of quartz for forming the gas flow passage around the circumference of the boat rotation shaft and providing the flow passage resistance (conductance) thereby resulting in a very high cost. Additionally, due to complexity of constructions such as lines and the like in a furnace opening portion of a CVD furnace, the constructions are difficult to manufacture from quartz and are liable to have insufficient strength to be able to stand.

Moreover, the conventional technique (c) has the construction wherein the barrier 63 of quartz is provided at a side of the cover body (made of metal), and the purge gas supply space 73 is formed by the barrier 63 and a rotation wall opposite to the barrier, and a purge gas is fed from the space to a side of the rotation shaft which has a narrow space, so that the purge gas has difficulty in passing through in a direction of the rotation shaft whereby a perfect purge can not be easily performed. In addition, because the barrier having a special configuration which is relatively large is constructed from quartz, the construction is also difficult to manufacture, liable to have insufficient strength to be able to stand, and at a high cost, as is the case with the conventional techniques (a) and (b). Further, in the case of the conventional technique (c), the cover body 59 is exposed to the inside of the furnace so that the cover body 59 tends to become a source of pollution of a reaction atmosphere.

Furthermore, although the cover body is preferably provided with a cooling passage therein for cooling an O-ring, as shown in the conventional technique (b), the entire cover can be cooled due to high thermal conductivity of metal. As a result, by-products adhere to the cover body so that the cover body is liable to become a source of pollution of a reaction atmosphere.

SUMMARY OF THE INVENTION

Therefore, an object of the present invention is to provide a substrate processing apparatus and a method for manufacturing semiconductor device wherewith, by resolving the problems of the prior art that semiconductor film by-products are incorporated into a boat rotation mechanism so as to allow the mechanism portion to be locked, a high quality semiconductor film can be generated with stability for a long period of time.

In order to attain the above-described object, the present invention is constructed as follows:

The invention of claim 1 resides in a substrate processing apparatus comprising: a reaction chamber with an opening which defines a processing space; a heater which heats a substrate; a substrate supporting member which supports the substrate in said reaction chamber; a cover body, made of metal, which covers the opening of said reaction chamber via a seal member; a rotation mechanism which rotates said substrate supporting member supported by a rotation shaft; a flow passage, provided in said cover body, which cools said seal member; and an extending member which extends from said substrate supporting member; wherein the extending member includes: a drooping portion which extends in a direction from the substrate supporting member toward the cover body; and an extending portion which extends radially outwardly from a lower end of the drooping portion toward a reaction chamber wall and extends along a surface of the cover body exposed to the processing space.

According to the present invention, the cover body is made of metal so that the cover body is easy to manufacture compared to the case wherein the cover body is made of quartz, so as to allow the present invention to be advantageous with respect to cost. Additionally, the extending member which is provided from the substrate supporting member to the cover body is not only constructed to include the drooping portion which extends downwardly from an outer circumferential portion of the lower end of the substrate supporting member, but also constructed to include the extending portion which extends radially outwardly from the drooping portion, wherein the extending portion extends along the processing space exposed surface of the cover body toward the reaction chamber wall. This effectively provides a resistance (conductance) of a flow passage around a circumference of a rotation shaft in a radial section wherein the extending portion and the processing space exposed surface of the cover body are superimposed each other. A shielding construction of a rotating body constructed in such a manner as to allow a reactive gas to have difficulty in coming around to a rotation mechanism for rotating a substrate supporting member thereby being able to avert a situation where a rotation portion does not work. In addition, in the present invention, it is necessary only to provide the extending member, and it is not necessary to form and provide the barrier 63 made of quartz which is large and has the special configuration as in the conventional technique (c) explained in FIG. 4.

Further, in the present invention, since the extending portion of the extending member and the processing space exposed surface of the cover body are superimposed each other in the radial section, giving and receiving of heat between both the members is effectively conducted. That is, although the cooling flow passage for seal member which is formed inside of the cover body made of metal attempts to cool the cover body, the cover body effectively receives heat from the extending portion of the extending member so as to be warmed. This avoids a disadvantage wherein a temperature of the cover body is reduced so that by-products in substrate processing are liable to adhere to the cover body.

The invention of claim 2 resides in a substrate processing apparatus according to claim 1, wherein a clearance between said surface of the cover body and the extending portion of said extending member and a clearance between said reaction chamber wall and the extending portion of said extending member are formed to be relatively narrow r, 1 to 5 mm respectively.

The reason why lower limits of the clearance between the above-described surface of the cover body and the extending portion of the extending member and the clearance between the above-described reaction chamber wall and the extending portion of the extending member are set to be 1 mm or more is that less than 1 mm makes it difficult to realize assembling due to mechanical dimensional accuracy so that 1 mm becomes a limit. Additionally, the reason why upper limits of the clearances are set to be 5 mm or less is that the clearances having a size of more than 5 mm makes it difficult to provide an effective flow passage resistance (conductance) between the rotation mechanism and a reaction chamber and also allows a warming action by the extending member of the cover body to become ineffective.

The invention of claim 3 resides in a substrate processing apparatus comprising: a reaction chamber with an opening which defines a processing space: a heater which heats a substrate; a substrate supporting member which supports the substrate in said reaction chamber; a cover body, made of metal, which covers the opening of said reaction chamber via a seal member; a flow passage, provided ind said cover body, which cools said seal member; and an extending member which extends from said substrate supporting member and extends along a proximity of a surface of the cover body exposed to the processing space; wherein said cover body is warmed with heat which transfers from said substrate supporting member to said extending member.

In the present invention of claim 3, heat transferred from the substrate supporting member to the extending member warms the cover body. In the case that giving and receiving of heat between both the members is not performed effectively, the cooling flow passage which is formed inside of the cover body made of metal cools the cover body so that by-products in substrate processing is liable to adhere to the cover body. However, in the present invention, since the cover body is effectively warmed with the heat from the extending member so as to avoid a disadvantage wherein a temperature of the cover body is reduced so that by-products in substrate processing is liable to adhere to the cover body.

The invention of claim 4 resides in a substrate processing apparatus according to claim 3, wherein a clearance between said extending member and said surface of the cover body is formed to be of the order of 1 to 5 mm.

The reason why a lower limit of the clearance between the extending member and the surface of the above-stated cover body is set to be 1 mm or more is that less than 1 mm makes it difficult to realize assembling due to mechanical dimensional accuracy so that 1 mm becomes a limit. Additionally, the reason why an upper limit of the clearance is set to be 5 mm or less is that the clearance having a size of more than 5 mm allows a warming action by the extending member of the cover body to become ineffective.

The invention of claim 5 resides in a method for manufacturing a semiconductor device, comprising:

supporting a substrate on a substrate supporting member; inserting said substrate supporting member into a reaction chamber; covering an opening of the reaction chamber with a cover body made of metal via a seal member; rotating said substrate supporting member by a rotation shaft of a rotation mechanism; flowing a purge gas radially outwardly from a side of the rotation shaft along a flow passage formed between the surface of said cover body exposed to a processing space and an extending member which extends from said substrate supporting member and extends radially outwardly along the surface of the cover body exposed to the processing space; introducing a reaction gas into the reaction chamber in order to process said substrate; and exhausting said introduced reaction gas from an inside of said reaction chamber.

According to the invention described in claim 5, after the step is performed which flowing a purge gas along a flow passage formed between the surface of said cover body exposed to a processing space and an extending member which extends from said substrate supporting member and extends radially outwardly along the surface of the cover body exposed to the processing space, the step is performed which introduces the reaction gas into the reaction chamber in order to process the said substrate. The purge gas is flowed radially outwardly from the side of the rotation shaft and a perfect purge is conducted around a circumference of the rotation shaft of the substrate supporting member so that air and the like do not remain around the circumference of the rotation shaft.

The invention of claim 6 resides in a method for manufacturing a semiconductor device, comprising:

supporting a substrate on a substrate supporting member; inserting said substrate supporting member on which said substrate is supported, into a reaction chamber from an opening of said reaction chamber in which a processing space is formed; covering the opening of the reaction chamber with a cover body made of metal via a seal member; flowing a fluid into a flow passage provided in said cover body for cooling said seal member; heating said substrate; including an extending member which is extended from said substrate supporting member and extends along a proximity of a surface of the cover body exposed to said processing space and warming said cover body with heat which transfers from said substrate supporting member to said extending member; introducing a reaction gas into said reaction chamber in order to process said substrate; and exhausting said introduced reaction gas from an inside of said reaction chamber.

According to the invention described in claim 6, although the cover body is cooled in flowing a fluid into a flow passage for cooling the seal member, added is warming the cover body with heat which transfers from the substrate supporting member to the extending member. Therefore, by-products in substrate processing is not liable to adhere to the cover body.

The invention of claim 7 resides in a method for manufacturing a semiconductor device according to claim 5 or 6, wherein a clearance between said extending member and said surface of the cover body is formed to be of the order of 1 to 5 mm.

According to the invention described in claim 7, when a clearance between the extending member and the surface of the cover body is formed to be of the order of 1 to 5 mm, a warming action by the extending member of the cover body becomes more effective.

DESCRIPTION OF THE PREFERRED EMBODIMENTS

The present invention will be described below based on illustrated embodiments.

Figure 1:
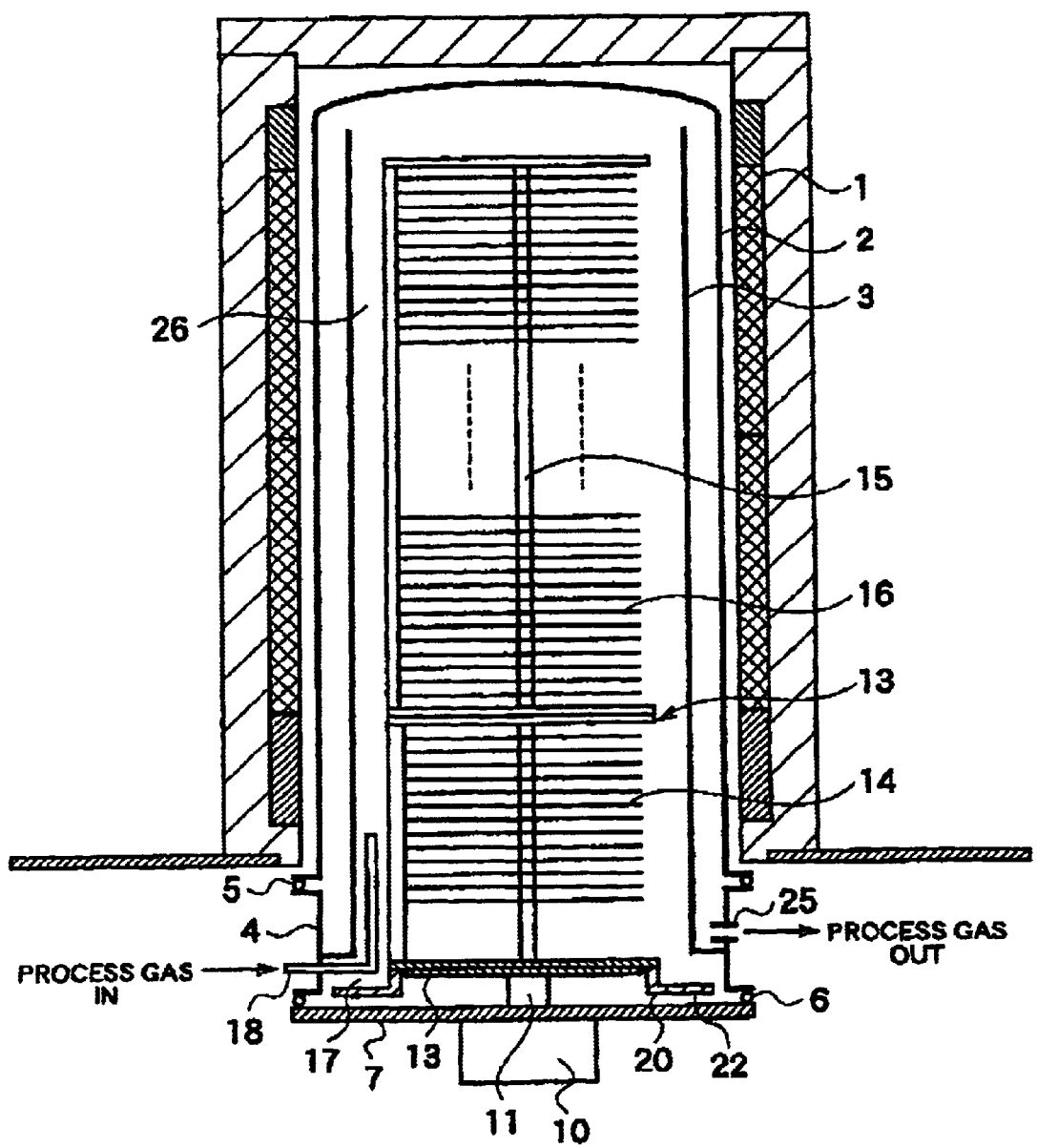
FIG. 1 is a schematic view for illustrating in general a substrate processing apparatus of the present invention.

FIG. 1 is a schematic view of a vertical type reaction furnace A relating to a substrate processing apparatus. Here, the reaction furnace is of a double tube structure. However, the double tube structure is not an essential matter to the present invention, and the present invention can also be applied to a single tube structure.

Inside of a cylindrical heater 1 which is closed at its upper portion, there is provided a cylindrical outer reaction tube 2 made of quartz, and within the outer reaction tube 2, there is concentrically provided a cylindrical inner reaction tube 3 made of quartz with an upper end being opened. The outer reaction tube 2 is vertically disposed on an upper end of a furnace opening flange 4, and the outer reaction tube 2 and the furnace flange 4 are sealed therebetween by an O-ring 5. The inner reaction tube 3 is vertically disposed on a reaction tube receiving portion 4a (FIG. 2) which projects radially inwardly from an inner wall of the furnace opening flange 4. A lower end of the furnace opening flange 4 is airtightly covered with a cover body 7 via an O-ring 6.

A base 9 is secured to the cover body 7 via a sealing auxiliary member 9a and a bellows 8 which is a elastic member capable of freely expanding and contracting with airtightness maintained, in such a way that the base 9 can be elastically displaced an up-and-down directions. Additionally, a boat rotation mechanism 10 is secured to the base 9 via a sealing auxiliary member 9b. Moreover, a susceptor 12 made of metal (here, made of stainless) is secured to a top of a rotation shaft 11 of the boat rotation mechanism 10. On the susceptor 12, a boat supporting base 13 is secured, which is a substrate supporting member made of SiC, $SiO_2$ (quartz) or Si in which shielding plates 14 comprising dummy wafers are contained.

A boat 15 made of SiC, $SiO_2$ (quartz) or Si which is vertically disposed on the boat supporting base 13 is inserted into the inner reaction tube 3. In the boat 15, wafers 16 of silicon or the like on which film formation is to be performed are loaded being horizontally oriented in a multi-storied fashion so that a plurality of wafers 16 are constructed to be subjected to a batch process.

The furnace opening flange 4 is airtightly covered with the cover body 7 so as to form a closed space 17. A skirt 20 as an extending member is provided at a circumferential end of a lower end of the boat supporting base 13 in such a fashion as to extend into the closed space 17.

Figure 2:
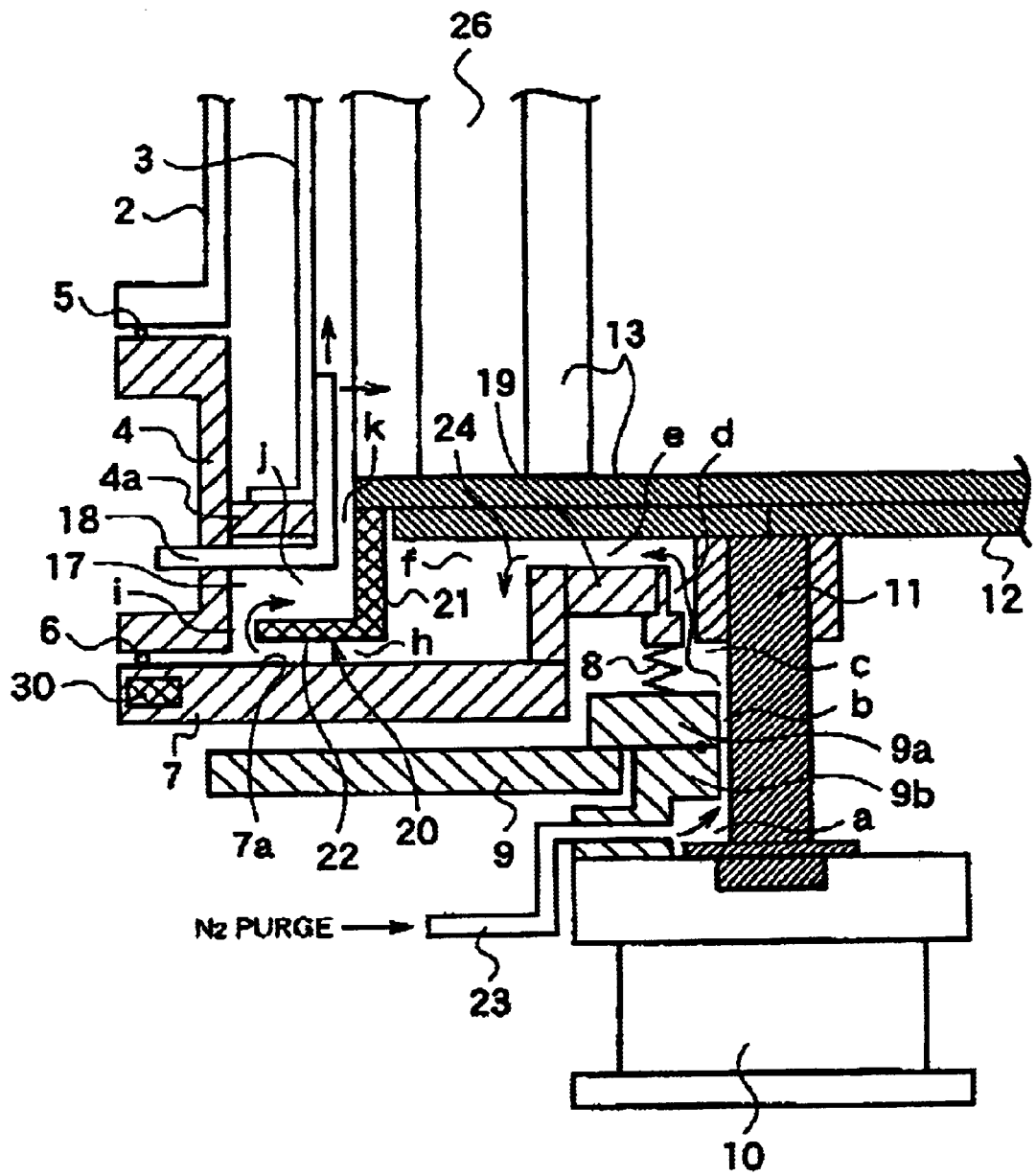
FIG. 2 is an enlarged view for illustrating details of an opening portion of substrate processing apparatus of the above-described FIG. 1.
Figure 3:
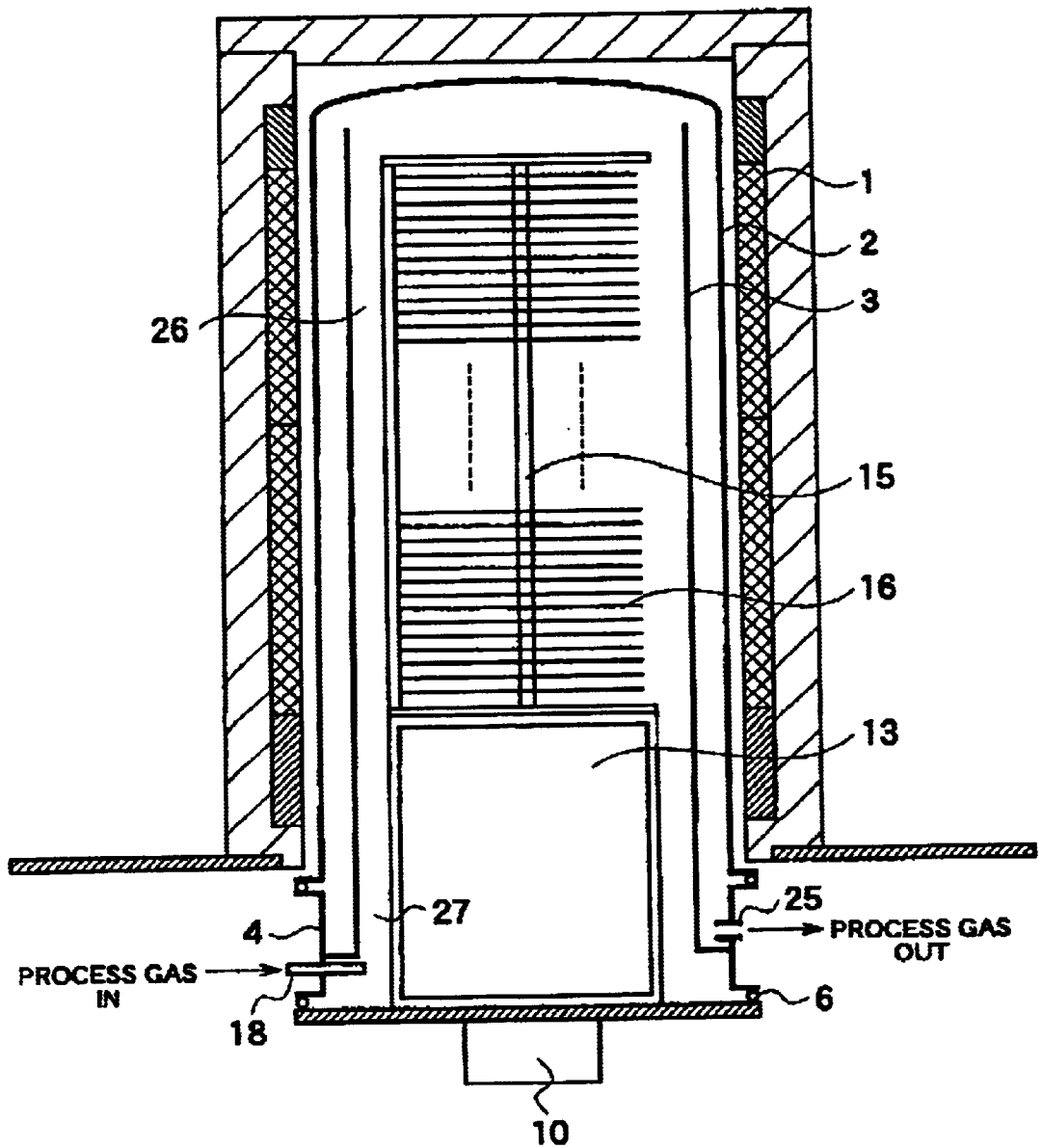
FIG. 3 is a schematic view for illustrating in general a conventional substrate processing apparatus.
Figure 4:
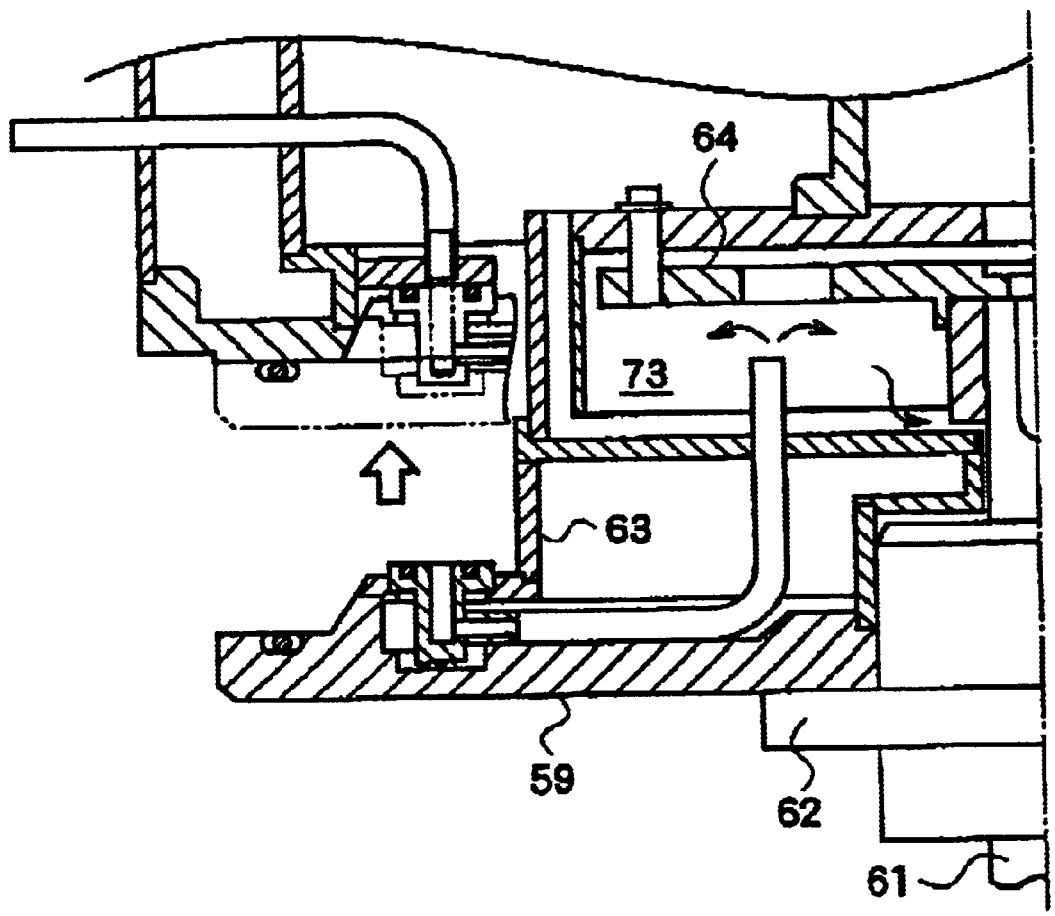
FIG. 4 is a view for illustrating an opening portion in a conventional substrate processing apparatus.

FIG. 2 shows in enlarged dimension a portion from the above-described boat rotation mechanism 10 to a proximity of the skirt 20.

In FIG. 2, the furnace opening flange 4 is airtightly covered with the cover body 7 so as to form the closed space 17 enclosed with a the furnace opening flange 4, the reaction tube receiving portion 4a, the susceptor 12 and the cover body 17.

The above-described reaction tube receiving portion 4a in a state in which the boat is inserted in the inner reaction tube 3, is provided at an opposite position to a side of the susceptor 12 (or the boat supporting base 13). The closed space 17 is in communication with an inside of a reaction chamber of the inner reaction tube 3 through a clearance k between the reaction tube receiving portion 4a and the susceptor 12 (or the boat supporting base 13). Further, a vertical portion of an L-shaped process gas introduction tube (process gas introduction nozzle) 18 which is provided at the furnace opening flange 4, is inserted into the clearance k. In addition, the furnace opening flange 4 is also provided with a gas exhaust tube 25.

Moreover, an inwardly directed flange 19 is formed to be of an inverted L-shaped cross section at a rotation shaft 11 side of the cover body 7. The skirt 20 is extended into a space between the inwardly directed flange 19 and a inner circumferential wall (a reaction chamber wall) of the furnace opening flange 4 from the outer circumferential portion of the lower end of the boat supporting base 13.

The skirt 20 includes: a drooping portion 21 which extends downwardly from the outer circumferential portion of the lower end of the boat supporting base; and an extending portion 22 which extends radially outwardly from a lower end of the drooping portion 35 immediately to a front of the inner circumferential wall (the reaction chamber wall) of the furnace opening flange 4 and extends along a processing space exposed surface 7a of the cover body 7 made of metal.

The sealing auxiliary member 9 is connected to an inner end of the inwardly directed flange 19 via the bellows 8, and the sealing auxiliary member 9 is provided with a purge gas introduction opening 23 for a purge gas N2.

Therefore, a purge gas flow passage 24 is formed from the purge gas introduction opening 23,→a clearance a between the purge gas introduction opening 23 and a circumference of the rotation shaft 11,→a clearance b between an inner circumferential surface of the sealing auxiliary member 9 and the circumference of the rotation shaft 11,→a clearance c between an inner circumferential surface of the bellows 8 and the circumference of the rotation shaft 11,→a clearance d between an inner circumferential surface of the inwardly directed flange 19 and the circumference of the rotation shaft 11,→a clearance e between an upper surface of the inwardly directed flange 19 and a lower surface of the susceptor 12,→a clearance f between an upper surface of the cover body 7 and the lower surface of the susceptor 12,→a clearance h between the upper surface of the cover body 7 and a lower surface of the extending portion 22 of the skirt 20,→a clearance i between an outer circumferential end surface of the extending portion 22 of the skirt 20 and the inner circumferential wall (the reaction chamber wall) of the furnace opening flange 4,→a clearance j between an upper surface of the extending portion 22 of the skirt 20 and a lower surface of the reaction tube receiving portion 4a, and→the clearance k between an inner circumferential end surface and a lower surface of the reaction tube receiving portion 4a, and an outer circumferential surface of the drooping portion 21 of the skirt 20. That is, since the purge gas is allowed to flow radially outwardly from the side of the rotation shaft 11 so as to maintain the circumference of the rotation shaft 11 of the boat supporting base 13 at a positive pressure, a perfect purge is performed around the circumference of the rotation shaft 11 so that air and the like do not remain around the circumference of the rotation shaft 11.

Here, the clearance h between the above-described cover body 7 and the extending portion 22 of the above-described skirt 20 and the clearance i between the inner circumferential wall (the reaction chamber wall) of the furnace opening flange 4 and the extending portion 22 of the above-described skirt 20 are formed to be of the order of 1 to 5 mm, respectively, which is relatively narrow. The reason why lower limits of the clearances h and i are set to be 1 mm or more is that less than 1 mm makes it difficult to realize assembling due to mechanical dimensional accuracy so that 1 mm becomes a limit. Additionally, the reason why upper limits of the clearances h and i are set to be 5 mm or less is that the clearances having a size of more than 5 mm makes it difficult to provide an effective line resistance (conductance) between the rotation mechanism portion and a reaction chamber. In addition, the reasons are because the range of 1 to 5 mm is a clearance dimension wherein heat easily radiates from the viewpoint of the under-mentioned warming action on the cover body 7 and because it is a dimension wherein a gas has difficulty in coming around.

Next, functions of the above-described construction will be explained.

The wafers 16 are loaded on the boat 15, and a process gas is introduced from the process gas introduction tube 18, and the process gas is exhausted through the gas exhaust tube 25. In this process, a semiconductor film is formed on the wafers 16 heated by the heater 1 by chemical-vapor deposition.

The boat rotation mechanism 10 comprises the rotation shaft 11 and the susceptor 12, and the boat supporting base 13 which is provided with the skirt 20 made of material such as Sic, quartz ($SiO_2$) or Si loaded on a skirt receiver, rotates on its axis. In addition, the skirt 20 is preferably constructed from the same material as the boat supporting base 13 and the boat 15.

The process gas is introduced into a reaction chamber 26 through a process gas introduction tube 18. The construction of the process gas introduction tube 18 is of an L-shape so as to be able to emit the gas in such a way that the gas moves away from a furnace opening 27 thereby allowing the gas to have difficulty in coming around to the inside of the skirt. Therefore, the process gas introduction tube 18 has such a construction that the reactive gas has difficulty in diffusing to the furnace opening portion.

In such a manner, a shielding structure by the skirt 20 is located around the circumference of the rotation shaft 11 of the boat rotation mechanism 10, and a line resistance (conductance) by the flow passage 24 is provided between the reaction chamber 26 and the rotation mechanism portion with the rotation shaft 11 being as a center so that, in substrate processing, a process gas does not come around to the circumference of the rotation shaft 11. Therefore, as a first feature, according to the above-described embodiment, the conventional problem that by-products formed by intrusion of a process gas into a clearance of the rotation shaft 11 from the reaction chamber 26 adhere to the rotation shaft so as to stop the rotating motion thereof, can be prevented.

In addition, since a purge gas $N_2$ is introduced from the purge gas introduction opening 23 so that the flow passage 24 within the skirt 20 can be purged by nitrogen, air which stays in the skirt 20 can be preserved from affecting the process. During standby of the apparatus, the inside of the skirt 20 is kept in a state in which nitrogen has flowed therethrough so as to decrease the intrusion of air. Further, in the case of setting the inside of the reaction chamber in a vacuum state, the inside of the skirt 20 is purged by nitrogen in an initial state so as to prevent the atmosphere from staying. In addition, the introduction of a purge gas may be conducted only when the boat 15 is inserted into the reaction chamber.

A method for manufacturing a semiconductor device comprises: (A) holding wafers 16 in a multi-storied fashion which are semiconductor substrates, in a boat 15, supporting the boat 15 by the boat supporting base 13, inserting it into the inner reaction tube 3 of the vertical type reaction furnace, and covering the opening 27 of the inner reaction tube 3 with the cover body 7 made of metal via the O-ring 6; (B) flowing a purge gas along the flow passage 24 formed between the processing space exposed surface 7a of the cover body 7 and the extending portion 22 which extends radially outwardly at the lower end of the skirt 20 made of any material of SiC, Si or $SiO_2$ provided at the lower end the boat supporting base 13, whereby at least around the circumference of the rotation shaft 11 of the boat supporting base 13 is maintained at a positive pressure; (C) introducing a reaction gas into the inner reaction tube 3 of the reaction furnace in order to process the semiconductor substrates; and (D) exhausting the introduced reaction gas from the inside of the inner reaction tube 3 (the reaction processing space) of the reaction furnace.

On the other hand, inside of the above-described cover body 7 made of metal, the flow passage for cooling 30 is formed at a position opposed to the O-ring 6 which is the seal member. This flow passage for cooling (in this example, a water passage) 30 is for water-cooling a vicinity of the O-ring 6 so that the flow passage for cooling serves to prevent the O-ring 6 from being so heated that the sealing action it inhibited.

As already mentioned above, in the CVD furnace, due to complexity of constructions such as lines and the like in the furnace opening portion 27, the construction using the conventional cover body and barrier made of quartz is difficult to manufacture and are liable to have insufficient strength to be able to stand. However, according to the present embodiment, the flange structure made of metal is adopted, and as a result, the cover body 7 is also made of metal, so that they are easy to manufacture. In addition, since the skirt 20 made of quartz and the like provides a line resistance (conductance) for the flow passage 24 around the circumference of the rotation shaft 11 along the cover made of metal, the substrate processing apparatus which has a simple structure and sufficient durability in strength, is obtained.

Incidentally, in the case that the above-described skirt 20 is not provided, since the cooling passage 30 for cooling the O-ring is provided in the cover body 7, the entire cover body 7 is allowed to be cooled due to the high thermal conductivity of metal. As a result, in substrate processing, by-products adhere to the cover body 7.

However, in the present embodiment, since the extending portion 22 of the skirt 20 which is a gas shielding member is provided along the processing space exposed surface 7a of the cover body 7 made of metal, an action wherein a portion of the cover body 7 which is cooled by the action of the flow passage for cooling 30 is warmed by heat supplied from the extending portion 22, is conducted. Therefore, the disadvantage wherein by-products which adhere due to a low temperature of the cover body 7 in substrate processing serve as a source of contamination in the subsequent processing is avoided To make a long story short, the provision of the skirt 20 has the effect of killing two birds with one stone, that is, the effects of (i) preventing a gas from coming around and (ii) preventing by-products from adhering to the cover body (due to warming of the cover).

Conventionally, the CVD processing has been performed at 780 to 800° C. However, in the case of a low temperature process which is a recent trend (for example, with respect to nitride, the process temperature is 620 to 680° C.), since the furnace opening is still further cooled (difficult to warm) due to decrease of heat radiation from the inside of the furnace is decreased, warming through the skirt 20 becomes a very effective means. The temperature of the cover body 7 which requires warming is, for example, such a temperature that the cover body 7 is required to be warmed to about 150° C. in processing wherein TEOS is used at 700° C.

According to the present invention as explained above, the following excellent effects are obtained.

According to the substrate processing apparatus of the present invention, the cover body of the opening is made of metal so that the cover body is easy to manufacture compared to the case wherein the cover body is made of quartz, so as to allow the substrate processing apparatus to be advantageous with regard to cost. In addition, the extending member which extends from the substrate supporting member is provided, and this extending member is further constructed to include the drooping portion which extends toward the cover body and the extending portion which extends radially outwardly from the lower end of the drooping portion, wherein the extending portion extends along the processing space exposed surface of the cover body immediately to the front of the reaction chamber wall. This effectively provides a resistance (conductance) of a flow passage or a line around the circumference of the rotation shaft in a relatively long radial section wherein the extending portion and the processing space exposed surface of the cover body are superimposed each other. The shielding construction of a rotating body constructed in such a manner as to allow a reactive gas to have difficulty in coming around to the rotation mechanism portion for rotating the substrate supporting member thereby being able to avert a situation where a rotation portion does not work due to adherence.

Moreover, in the substrate processing apparatus of the present invention, it is necessary only to provide the substrate supporting member as a part made of a material such as quartz or the like, and it is not necessary to form and provide the barrier made of quartz which is large and has the special configuration as in the prior art.

Furthermore, in the substrate processing apparatus of the present invention, since the extending portion of the substrate supporting member and the processing space exposed surface of the cover body are superimposed each other in the relatively long section in the radial direction, giving and receiving of heat between both the members is effectively conducted. That is, although the cooling flow passage for cooling the O-ring which is formed inside of the cover body made of metal attempts to cool the cover body, the cover body effectively receives heat from the extending portion of the substrate supporting member so as to be warmed, thereby avoiding a disadvantage wherein a temperature of the cover body is reduced so that by-products in substrate processing are liable to adhere to the cover body.

Additionally, according to the method for manufacturing of the present invention, since a purge gas is allowed to flow radially outwardly from the side of the rotation shaft along the flow passage formed between the processing space exposed surface of the cover body and the extending member which extends along the processing space exposed surface of the cover body radially outwardly as extending from the substrate supporting member, the purge gas is flowed radially outwardly from the side of the rotation shaft and a perfect purge is conducted around a circumference of the rotation shaft so that air and the like do not remain around the circumference of the rotation shaft

What is claimed is:

1. A substrate processing apparatus comprising:
   a reaction chamber with an opening which defines a processing space;
   a heater which heats a substrate;
   a substrate supporting member which supports the substrate in said reaction chamber;
   a cover body, made of metal, which covers the opening of said reaction chamber via a seal member;
   a rotation mechanism which rotates said substrate supporting member supported by a rotation shaft;
   a flow passage, provided in said cover body, which cools said seal member; and
   an extending member which extends from said substrate supporting member;
   wherein the extending member includes:
      a drooping portion which extends in a direction from the substrate supporting member toward the cover body; and
      an extending portion which extends radially outwardly from a lower end of the drooping portion toward a reaction chamber wall and extends along a surface of the cover body exposed to the processing space.

2. A substrate processing apparatus according to claim 1, wherein a clearance between said surface of the cover body and the extending portion of said extending member and a clearance between said reaction chamber wall and the extending portion of said extending member are formed to be of the order of 1 to 5 mm, respectively.

3. A substrate processing apparatus comprising:
   a reaction chamber with an opening which defines a processing space;
   a heater which heats a substrate;
   a substrate supporting member which supports the substrate in said reaction chamber;
   a cover body, made of metal, which covers the opening of said reaction chamber via a seal member;
   a flow passage, provided in said cover body, which cools said seal member; and
   an extending member which extends from said substrate supporting member and extends along a proximity of a surface of the cover body exposed to the processing space;
   wherein said cover body is warmed with heat which transfers from said substrate supporting member to said extending member.

4. A substrate processing apparatus according to claim 3, wherein a clearance between said extending member and said surface of the cover body is formed to be of the order of 1 to 5 mm.

* * * * *